(12) United States Patent
Wang (10) Patent No.: US 12,200,867 B2
(45) Date of Patent: Jan. 14, 2025

(54) SYNCHRONOUS RECTIFICATION ASSEMBLY, MANUFACTURING METHOD THEREOF AND POWER SUPPLY

(71) Applicant: Aplus Power Technology (Hangzhou) Co., Ltd., Hangzhou (CN)

(72) Inventor: Yuetian Wang, Hangzhou (CN)

(73) Assignee: APLUS POWER TECHNOLOGY (HANGZHOU) CO., LTD., Hangzhou (CN)

( * ) Notice: Subject to any disclaimer, the term of this patent is extended or adjusted under 35 U.S.C. 154(b) by 162 days.

(21) Appl. No.: 18/060,450

(22) Filed: Nov. 30, 2022

(65) Prior Publication Data

US 2023/0171892 A1    Jun. 1, 2023

(30) Foreign Application Priority Data

Nov. 30, 2021    (CN) .......................... 202111447674.2

(51) Int. Cl.
    *H05K 1/14*      (2006.01)
    *H01F 27/28*      (2006.01)
    *H02M 3/335*      (2006.01)

(52) U.S. Cl.
    CPC ............. *H05K 1/145* (2013.01); *H01F 27/28* (2013.01); *H02M 3/33592* (2013.01)

(58) Field of Classification Search
    CPC ...................................................... H05K 1/145
    See application file for complete search history.

(56) References Cited

U.S. PATENT DOCUMENTS 8,564,394 B2    10/2013   Li et al.
8,964,410 B2 *   2/2015   Chang .................... H05K 1/181
                                                       336/200

(Continued)

FOREIGN PATENT DOCUMENTS

CN          101399490 A      4/2009
CN          214626409 U      11/2011

(Continued)

OTHER PUBLICATIONS

First Office Action and search report issued on Aug. 16, 2023 for counterpart Chinese patent application No. 202111447674.2, along with machine EN translation.

(Continued)

*Primary Examiner* — Hung V Ngo (74) *Attorney, Agent, or Firm* — Hamilton, Brook, Smith & Reynolds, P.C.

(57) ABSTRACT

The present application provides a synchronous rectification assembly, a manufacturing method thereof and a power supply. The synchronous rectification assembly comprises a first circuit board, a transformer, an electrical connection piece and a second circuit board; wherein the transformer is electrically connected to the first circuit board, and the second circuit board is provided with a conductive contact for being electrically connected to an external apparatus, and the electrical connection piece is electrically connected to the first circuit board and the second circuit board respectively; the first circuit board is configured to perform synchronous rectification on the output signal of the transformer and then transmit the output signal to the conductive contact of the second circuit board through the electrical connection piece. The present application can solve the problem that the output signal outputted by the transformer in the existing (Continued)

synchronous rectification assembly has a large loss during transmission.

14 Claims, 6 Drawing Sheets

(56) References Cited

U.S. PATENT DOCUMENTS

| | | | |
|---|---|---|---|
| 10,881,773 B2 | 1/2021 | Rudser et al. | |
| 10,931,206 B2 | 2/2021 | Yamada | |
| 2005/0083665 A1 | 4/2005 | Nakashima et al. | |
| 2005/0189566 A1 | 9/2005 | Matsumoto et al. | |
| 2007/0152795 A1 | 7/2007 | Zeng et al. | |
| 2008/0074204 A1 | 3/2008 | Ichikawa et al. | |
| 2008/0076484 A1 | 3/2008 | Veselic | |
| 2009/0045897 A1 | 2/2009 | Yang et al. | |
| 2009/0309684 A1 | 12/2009 | Tsai et al. | |
| 2010/0033282 A1 | 2/2010 | Hsu et al. | |
| 2010/0045590 A1 | 2/2010 | Kumamoto et al. | |
| 2011/0032683 A1 | 2/2011 | Li et al. | |
| 2012/0099288 A1 | 4/2012 | Parish | |
| 2013/0188329 A1* | 7/2013 | Chang | H05K 1/18 361/836 |
| 2014/0169042 A1 | 6/2014 | Eguchi | |
| 2015/0078042 A1 | 3/2015 | Standing | |
| 2018/0191263 A1 | 7/2018 | Chida et al. | |
| 2018/0197673 A1 | 7/2018 | Njiende et al. | |
| 2018/0205323 A1* | 7/2018 | Cai | H01F 27/29 |
| 2019/0076587 A1 | 3/2019 | Rudser et al. | |
| 2019/0122806 A1* | 4/2019 | Chou | H05K 1/141 |
| 2019/0140551 A1* | 5/2019 | Lu | H05K 1/141 |
| 2019/0148061 A1 | 5/2019 | Lu et al. | |
| 2019/0378645 A1 | 12/2019 | Chiang et al. | |
| 2020/0153178 A1 | 5/2020 | Zhang et al. | |
| 2020/0320966 A1 | 10/2020 | Clark et al. | |
| 2021/0134520 A1 | 5/2021 | Koki | |
| 2021/0272737 A1 | 9/2021 | Jin et al. | |
| 2021/0305907 A1 | 9/2021 | Dong et al. | |
| 2021/0315112 A1 | 10/2021 | Song et al. | |
| 2022/0037074 A1 | 2/2022 | Tashiro | |
| 2023/0170819 A1* | 6/2023 | Wang | H02M 1/0048 361/760 |
| 2023/0170820 A1* | 6/2023 | Wang | H02M 3/003 363/21.06 |
| 2024/0038441 A1 | 2/2024 | Jiang et al. | |
| 2024/0055985 A1 | 2/2024 | Wang | |
| 2024/0072646 A1 | 2/2024 | Wang | |

FOREIGN PATENT DOCUMENTS

| | | |
|---|---|---|
| CN | 102881405 A | 1/2013 |
| CN | 104749426 A | 7/2015 |
| CN | 105099131 A | 11/2015 |
| CN | 105099160 A | 11/2015 |
| CN | 206388585 U | 8/2017 |
| CN | 107210681 A | 9/2017 |
| CN | 109787484 A | 5/2019 |
| CN | 207459970 U | 5/2019 |
| CN | 209516901 U | 10/2019 |
| CN | 112104201 A | 12/2020 |
| CN | 101296599 A | 2/2021 |
| CN | 212659384 U | 3/2021 |
| CN | 212936301 U | 4/2021 |
| CN | 213305278 U | 5/2021 |
| CN | 214101195 U | 8/2021 |
| CN | 113452271 A | 9/2021 |
| CN | 214154343 U | 9/2021 |
| JP | 2011-087367 A | 4/2011 |

OTHER PUBLICATIONS

First Office Action and search report issued on Aug. 16, 2023 for counterpart Chinese patent application No. 202111447685.0, along with machine EN translation.

Non-Final Rejection Mailed on Nov. 14, 2024 for U.S. Appl. No. 18/060,423, entitled "Synchronous Rectification Assembly, Manufacturing Method thereof and Power Supply," 11 page(s).

* cited by examiner

SYNCHRONOUS RECTIFICATION ASSEMBLY, MANUFACTURING METHOD THEREOF AND POWER SUPPLY

RELATED APPLICATION(S)

This application claims priority under 35 U.S.C. § 119 or 365 to China, Application No. 202111447674.2, filed Nov. 30, 2021. The entire teachings of the above application are incorporated herein by reference.

TECHNICAL FIELD

The present application relates to the technical field of a synchronous rectification device, in particular to a synchronous rectification assembly, a manufacturing method thereof and a power supply.

BACKGROUND

At present, the power supply of the server (PC) with the structure of a conductive contact (golden finger) has the advantages of simple and convenient maintenance process and improved work efficiency of the staff. Since the conductive contact needs to be in plug-in electrical connection to the corresponding position of the server, it needs to be provided at a certain height, so that the conductive contact is not in the same plane as the main board of the power supply, and a printed circuit board (PCB board) needs to be provided as a carrier of the conductive contact, namely, a golden finger board. When a synchronous rectification module of the power supply is provided, generally a secondary side of a transformer is connected to a synchronous rectification board, then the synchronous rectification board is welded to a power supply main board, and then the power supply main board and the golden finger board are connected together via a connection piece. The output signal outputted from the transformer needs to be transmitted to the golden finger board through the power supply main board, and then the output signal is transmitted to the server through the conductive contact of the golden finger board.

SUMMARY

It is an object of the present application to provide a synchronous rectification assembly, so as to solve the problem that the output signal outputted by the transformer in the synchronous rectification assembly has a large loss during transmission. It is another object of the present application to provide a manufacturing method of a synchronous rectification assembly. It is a further object of the present application to provide a power supply.

In order to achieve the above objects, an aspect of the present application discloses a synchronous rectification assembly, comprising a first circuit board, a transformer, an electrical connection piece and a second circuit board;

wherein the transformer is electrically connected to the first circuit board, and the second circuit board is provided with a conductive contact for being electrically connected to an external apparatus, and the electrical connection piece is electrically connected to the first circuit board and the second circuit board respectively;

the first circuit board is configured to perform synchronous rectification on the output signal of the transformer and then transmit the output signal to the conductive contact of the second circuit board through the electrical connection piece.

Alternatively, the transformer comprises a primary side assembly and a secondary side assembly, the secondary side assembly includes a plurality of secondary side windings, and the plurality of secondary side windings are electrically connected to the first circuit board.

Alternatively, each of the secondary side assemblies comprises a pin, and a metal hole corresponding to each of the pins is formed on the first circuit board;

The pins are in plug-in electrical connection to the corresponding metal holes on the first circuit board.

Alternatively, the primary side winding and the secondary side winding are in plural, and the primary side winding and the secondary side winding are arranged alternately.

Alternatively, the connection member includes a first connection member and a second connection member, and the conductive contact includes a positive power transmission contact and a negative power transmission contact;

the first connection member is electrically connected to the negative power transmission contact through wiring on the second circuit board;

the second connection member is electrically connected to the positive power transmission contact through wiring on the second circuit board.

Alternatively, the synchronous rectification assembly further comprises an inductor;

the inductor is provided on the second connection member.

Alternatively, the second circuit board includes a first region and a second region surrounding the outside of the transformer and being perpendicular to each other;

the conductive contact and the first connection member are disposed in the first region, and the second connection member is disposed in the second region.

Alternatively, the first circuit board is provided on top of the transformer.

Alternatively, the connection member is arranged vertically, the top of the connection member is in plug-in electrical connection to the first circuit board, and the bottom of the connection member is in plug-in electrical connection to the second circuit board.

Alternatively, the first circuit board is arranged parallel to the second circuit board.

Alternatively, the synchronous rectification assembly further comprises a power supply main board.

The power supply main board is arranged below the second circuit board.

Alternatively, at least two of the power supply main board, the second circuit board and the first circuit board are arranged in parallel.

The present application further discloses a manufacturing method of a synchronous rectification assembly, comprising:

electrically connecting a transformer to a first circuit board;

electrically connecting an electrical connection piece to the first circuit board and a second circuit board respectively, such that the first circuit board performs synchronous rectification on an output signal of the transformer and then transmits the output signal to a conductive contact of the second circuit board through the electrical connection piece, wherein the second circuit board is provided with a conductive contact for being electrically connected to an external apparatus.

The present application further discloses a power supply comprising a synchronous rectification assembly as described above.

The electrical connection piece of the synchronous rectification assembly of the present application is electrically connected to the first circuit board and the second circuit board, respectively. Wherein the first circuit board is electrically connected to the transformer, the second circuit board is provided with a conductive contact, and electrical connection between the first circuit board and the second circuit board can be realized through the electrical connection piece, thus, the output signal outputted from the transformer to the first circuit board can be transmitted to the second circuit board through the electrical connection piece after being rectified by the first circuit board, and further transmitted to the conductive contact through the second circuit board, so as to be transmitted to an external server through the conductive contact. Therefore, in the present application, the output signal output by the transformer is directly transmitted to the second circuit board provided with the conductive contact through the first circuit board. That is, the output signal output by the transformer is directly transmitted to the golden finger board through the synchronous rectification board, so as to be further output to the external server, without being transmitted to the golden finger board through the power supply main board. Therefore, in the present application, the output signal outputted by the transformer is transmitted to the conductive contact in a shorter transmission path, which shortens the transmission path of the output signal with large current and effectively reduces the energy loss of the output signal.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

To illustrate more clearly the embodiments of the present application or the technical schemes of the prior art, a brief description of the accompanying drawings in the embodiments or the prior art will be given below. Obviously, the accompanying drawings described below are only some embodiments described in this application. For those of ordinary skill in the art, other drawings can also be obtained without any creative labor from these drawings.

REFERENCE SIGNS 10. transformer; 11. synchronous rectification board; 111. switching element; 12. golden finger board; 121. conductive contact; 13. second circuit board; 131. electronic element; 14. connection piece; 20. transformer; 21. first circuit board; 211. switching element; 22. second circuit board; 221. conductive contact; 23. electrical connection piece; 231. first connection member; 232. second connection member; 24. inductor; 25. power supply main board; 251. electronic element.

DETAILED DESCRIPTION

A description of example embodiments follows.

Hereinafter the technical solution in the embodiments of the present application will be described clearly and integrally in combination with the accompanying drawings in the embodiments of the present application, and obviously the described embodiments are merely part of the embodiments, not all of the embodiments. Any other embodiment obtained by those skilled in the art based on the embodiments of the present application without paying any creative labor fall within the protection scope of the present application.

It should be noted that the terms "first," "second" and the like in the description and claims of the present application and in the above-mentioned drawings are used to distinguish between similar objects and are not necessarily used to describe a particular order or precedence. It should be understood that the data so used may be interchanged where appropriate for the purpose of the embodiments of the present application described herein. Furthermore, the terms "comprising" and "having" and any variations thereof are intended to cover non-exclusive inclusions, such as, for example, a process, a method, a system, a product or a device comprising a series of steps or units need not to be limited to those steps or units that are clearly listed, but may include other steps or units that are not explicitly listed or inherent to these processes, methods, products or devices.

In the present application, the orientation or positional relationship indicated by the terms "on", "under", "left", "right", "front", "back", "top", "bottom", "inside", "outside", "middle", "vertical", "horizontal", "transverse", "longitudinal" and the like is based on the orientation or positional relationship shown in the drawings. These terms are mainly intended to better describe the present application and its embodiments and are not intended to limit that the indicated devices, elements or constituents must have a particular orientation, or be constructed and operated in a particular orientation.

The positional relationship such as "parallel" or "vertical" includes not only the positional relationship of exactly "parallel" or "vertical," but also the positional relationship that the angle deviation relative to exactly "parallel" or "vertical" is within the preset deviation range.

Also, in addition to being used to represent an orientation or positional relationship, some of the above terms may also be used to indicate other meanings. For example, the term "on" may also be used in some cases to denote a certain attachment or connection. The specific meanings of these terms in the present application may be understood by those ordinarily skilled in the art as the case may be.

In addition, the terms "installation", "setting", "being provided with", "connecting", "connected", "sleeving" should be understood broadly. For example, the connection may be a fixed connection, a detachable connection or an integrated construction, or may be a mechanical connection or an electrical connection, or may be a direct connection, or may be an indirect connection through an intermediary, or an internal communication between two devices, elements or constituents. The specific meanings of the above terms in the present application may be understood by those ordinarily skilled in the art as the case may be.

It should be noted that the embodiments in the present application and the features in the embodiments can be combined with each other without conflict. Hereinafter, the present application will be described in detail with reference to the drawings and in connection with embodiments.

Figure 1:
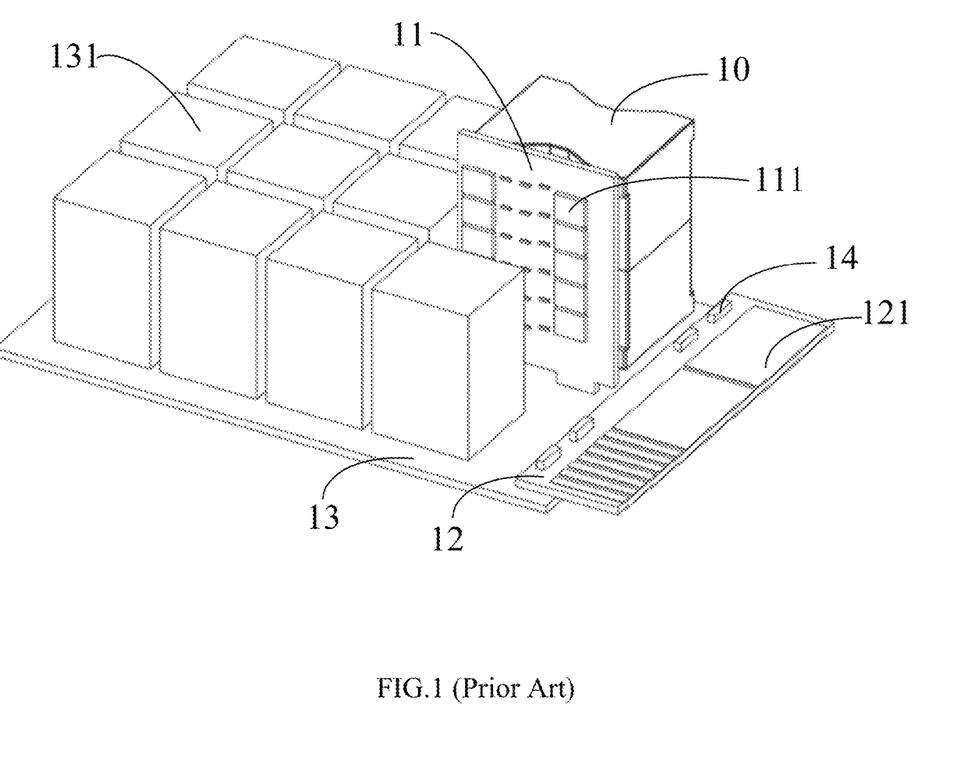
FIG. 1 shows a schematic diagram of a synchronous rectification assembly in the prior art.
Figure 2:
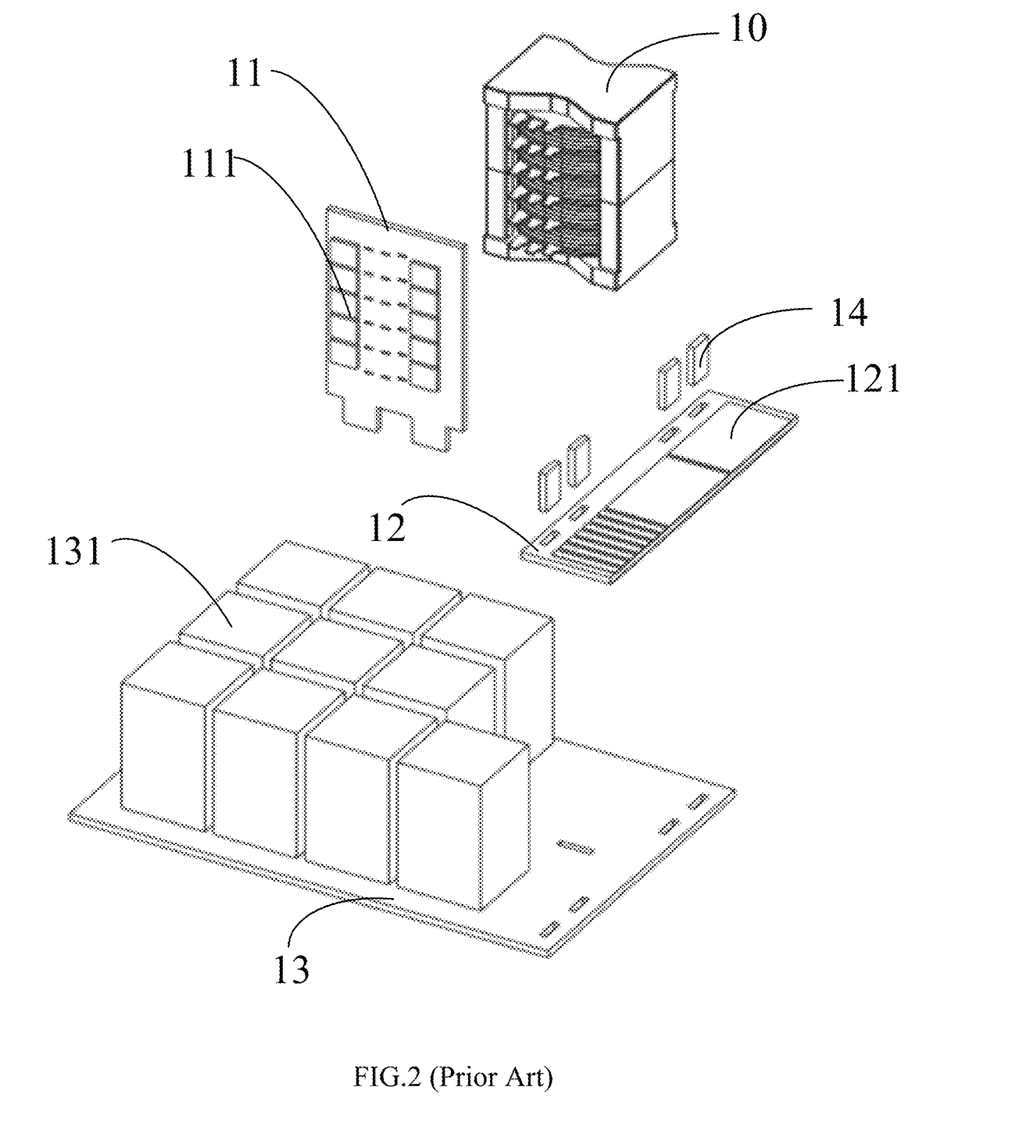
FIG. 2 shows an exploded view of a synchronous rectification assembly in the prior art.

As shown in FIGS. 1 and 2, at present, the transformer 10 of the server power supply is electrically connected to the synchronous rectification board 11, and is disposed on the power supply main board 13 together with the synchronous rectification board 11, wherein the synchronous rectification board 11 is further provided with a plurality of switching elements 111. The synchronous rectification board 11 is electrically connected to the power supply main board 13, so that the signals on the synchronous rectification board 11 can be transmitted to the power supply main board 13. The power supply main board 13 is further provided with a plurality of electronic elements 131 such as chips. The golden finger board 12 for being electrically connected to an external server is provided with a conductive contact 121 that can transmit an output signal on the golden finger board 12 to the server when the golden finger board 12 is electrically connected to the external server. The golden finger board 12 is further electrically connected to the power supply main board 13 through the connection piece 14. Thus, the output signal outputted from the transformer 10 is rectified by the synchronous rectification board 11, and then transmitted to the power supply main board 13, and then transmitted to the golden finger board 12 through the power supply main board 13, and transmitted to the external server through the conductive contact 121 on the golden finger board 12, so that the path of the processed output signal outputted from the synchronous rectification board 11 is relatively long, which causes a relatively large loss. Furthermore, the transformer 10 and the synchronous rectification board 11 are arranged on the power supply main board 13, a plurality of electronic elements 131 are further arranged on the power supply main board 13, the transformer 10 is arranged vertically with respect to the power supply main board 13, and the transformer 10 mainly dissipates heat by air flow in a horizontal direction. In this case, the electronic elements provided on the power supply main board 13 block the air flow in the horizontal heat dissipation direction of the transformer 10, resulting in poor heat dissipation effect of the transformer 10.

Figure 3:
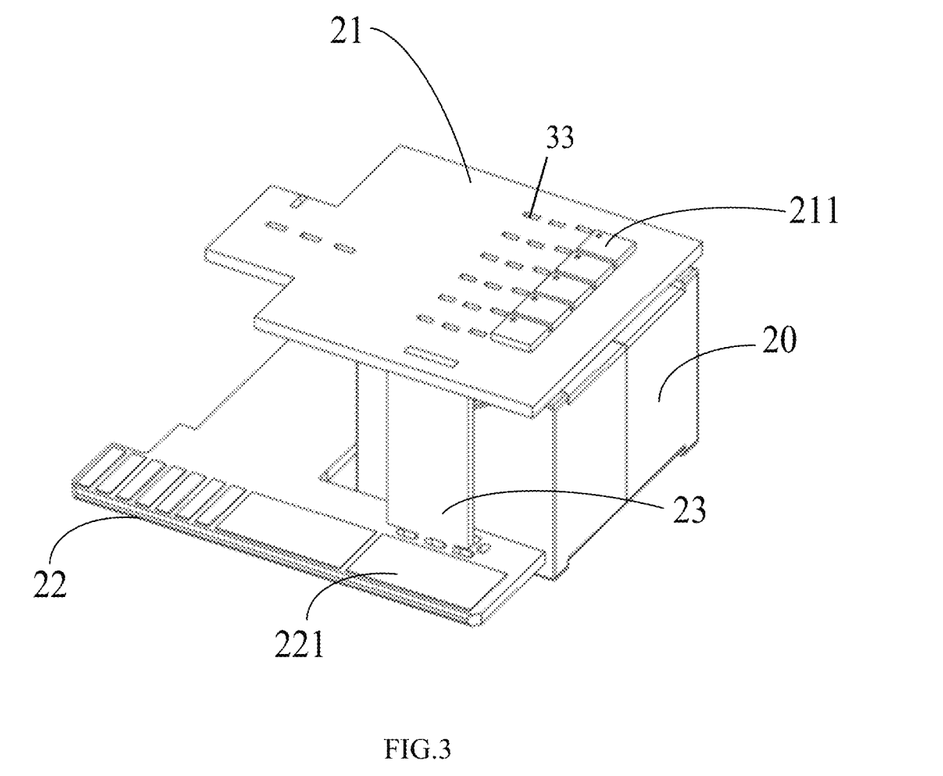
FIG. 3 shows a schematic diagram of a synchronous rectification assembly according to a specific embodiment of the present application.
Figure 4:
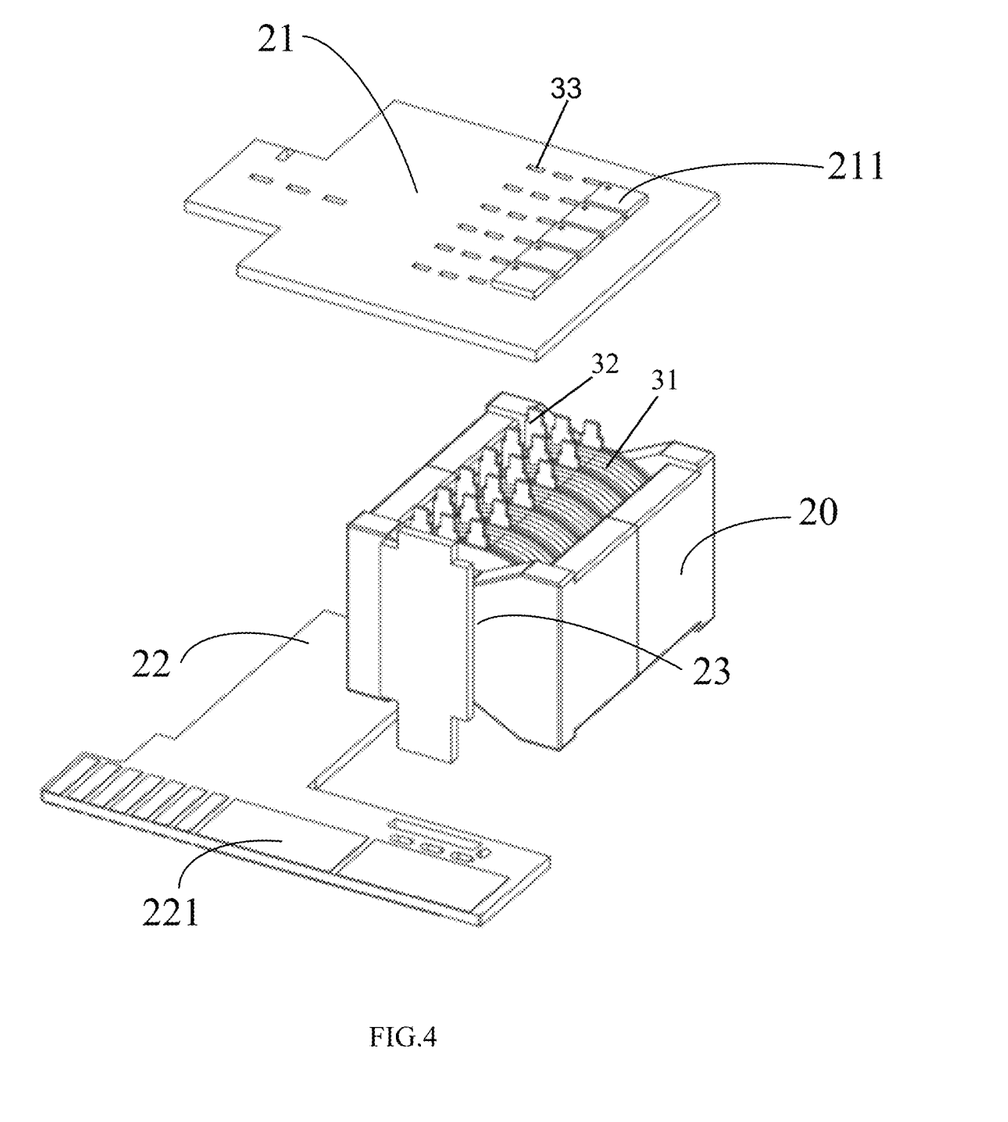
FIG. 4 shows an exploded view of a synchronous rectification assembly according to a specific embodiment of the present application.

Based on the above-mentioned issues, according to an aspect of the present application, the present embodiment discloses a synchronous rectification assembly. As shown in FIGS. 3 and 4, the synchronous rectification assembly includes a first circuit board 21, a transformer 20, an electrical connection piece 23, and a second circuit board 22.

Wherein the transformer 20 is electrically connected to the first circuit board 21, and the second circuit board 22 is provided with a conductive contact 221 for being electrically connected to an external apparatus, and the electrical connection piece 23 is electrically connected to the first circuit board 21 and the second circuit board 22 respectively.

The first circuit board 21 is configured to perform synchronous rectification on the output signal of the transformer 20 and then transmit the output signal to the conductive contact 221 of the second circuit board 22 through the electrical connection piece 23.

The electrical connection piece 23 of the synchronous rectification assembly of the present application is electrically connected to the first circuit board 21 and the second circuit board 22, respectively. Wherein the first circuit board 21 is electrically connected to the transformer 20, the second circuit board 22 is provided with a conductive contact 221, and electrical connection between the first circuit board 21 and the second circuit board 22 can be realized through the electrical connection piece 23, thus, the output signal outputted from the transformer 20 to the first circuit board 21 can be transmitted to the second circuit board 22 through the electrical connection piece 23 after being rectified by the first circuit board 21, and further transmitted to the conductive contact 221 through the second circuit board 22, so as to be transmitted to an external server through the conductive contact 221. Therefore, in the present application, the output signal output by the transformer 20 is directly transmitted to the second circuit board 22 provided with the conductive contact 221 through the first circuit board 21. That is, the output signal output by the transformer 20 is directly transmitted to the golden finger board through the synchronous rectification board, so as to be further output to the external server, without being transmitted to the golden finger board through the power supply main board 25. Therefore in the present application, the output signal outputted by the transformer is transmitted to the conductive contact 221 in a shorter transmission path, which shortens the transmission path of the output signal with large current and effectively reduces the energy loss of the output signal.

It should be noted that, in this embodiment, the first circuit board 21 is a synchronous rectification board, and the output signal of the transformer 20 can be synchronously rectified and then transmitted to the second circuit board 22 through the electrical connection piece 23, and the synchronous rectifier board is provided with a plurality of switching elements 211 and the like; the second circuit board 22 is provided with a conductive contact 221, which is a golden finger board.

In an alternative embodiment, the transformer 20 comprises a primary side assembly 31 and a secondary side assembly (not shown), the secondary side assembly includes a plurality of secondary side windings (not shown), and the plurality of secondary side windings are electrically connected to the first circuit board 21.

It can be understood that the power supply voltage of the server is low, it is necessary to perform voltage conversion on a high-voltage power supply signal via the transformer 20 and to obtain a low-voltage direct current signal after a series of processing, such as rectification processing, etc., and thereafter the direct current signal is transmitted to the server through the electrical connection piece and the second circuit board to supply power to the server. In an alternative embodiment, the transformer 20 is an LLC (resonant circuit) transformer, a resonant circuit may be provided on the power supply main board, and the primary side assembly 31 of the transformer is electrically connected to the resonant circuit.

In this embodiment, the transformer 20 comprises a primary side assembly 31 and a secondary side assembly, wherein the secondary side assembly includes a plurality of secondary side windings, the primary side assembly 31 can be connected to an external circuit (such as a resonant circuit on the main board) to receive a high-voltage power supply signal of the external circuit, the secondary side assembly is electrically connected to the synchronous rectification board 21, and the secondary side assembly of the transformer 20 outputs a transformed output signal to the synchronous rectification board 21. Wherein the secondary side assembly is a low voltage output side, and alternatively the voltage of the output signal is less than 20V.

In an alternative embodiment, the primary side assembly 31 includes a plurality of primary side windings disposed on a magnetic core of the transformer, and the plurality of secondary side assemblies are also disposed on the magnetic core.

In an alternative embodiment, the primary side winding and the secondary side winding are in plural, the primary side winding and the secondary side winding are arranged alternately to reduce leakage inductance and AC loss of the windings. In other embodiments, the primary side assembly 31 and the secondary side assembly of the transformer 20 can also adopt other structures as long as the function of the transformer 20 can be realized, and this is not limited in the present application.

In an alternative embodiment, the secondary side winding is a copper sheet. In other embodiments, the secondary side winding may also be made of other structures or materials, and this is not limited in the present application.

In an alternative embodiment, the pin 32 may be made of a copper material. The secondary side winding made of the copper sheet may be formed integrally with the pin 32, or may be formed separately and then connected and fixed, and the pin 32 may also be made of other materials, which is not limited in this application.

In an alternative embodiment, the primary side winding has an insulating layer. In other alternative embodiments, an insulating layer may be provided on the secondary side winding, or an insulating layer may be provided on each of the primary side winding and the secondary side winding to achieve insulation between the primary side winding and the secondary side winding.

In an alternative embodiment, each of the secondary side assemblies comprises a pin 32, and a metal hole 33 corresponding to each of the pins 32 is formed on the first circuit board 21. The pins 32 are in plug-in electrical connection to the corresponding metal holes 33 on the first circuit board 21.

It can be understood that by providing the pins 32 in the secondary side assembly, opening the metal holes 33 in the first circuit board 21, and causing the positions of the metal holes 33 to correspond to the pins 32 of the secondary side assembly, the pins 32 of the secondary side assembly can be correspondingly inserted into the metal holes 33 of the first circuit board 21, and then the pins 32 are electrically connected and fixed to the metal holes 33 by soldering or the like, so as to realize the plug-in electrical connection between the transformer 20 and the first circuit board 21. In this embodiment, the transformer 20 is in plug-in electrical connection to the first circuit board 21, and such connection is simple, has a compact structure and facilitates the miniaturization of the structure.

In an alternative embodiment, the connection member includes a first connection member 231 and a second connection member 232, and the conductive contact 221 includes a positive power transmission contact and a negative power transmission contact.

Wherein the first connection member 231 is electrically connected to the negative power transmission contact through wiring on the second circuit board 22, and the second connection member 232 is electrically connected to the positive power transmission contact through wiring on the second circuit board 22.

It can be understood that ends of the rectified high-power output signal outputted by the synchronous rectification board includes a positive power output end and a negative power output end. The positive power output end needs to be electrically connected to the first connection member 231, and is connected to an external server through the first connection member 231, the second circuit board 22 and a positive power transmission contact, the negative power output end needs to be electrically connected to the second connection member 232, and is connected to the external server through the second connection member 232, the second circuit board 22 and a negative power transmission contact, so as to form a complete circuit.

In an alternative embodiment, the second circuit board 22 includes a first region and a second region surrounding the outside of the transformer 20 and being perpendicular to each other. The conductive contact 221 and the first connection member 231 are disposed in the first region, and the second connection member 232 is disposed in the second region.

It can be understood that in order to provide the first connection member 231 and the second connection member 232 to realize the electrical connection between the first circuit board 21 and the second circuit board 22, in the alternative embodiment, in order to reduce the occupation and influence of the second circuit board 22 on the power supply internal space, the second circuit board 22 is provided to include a first region and a second region surrounding the outside of the transformer 20, then the first connection member 231 and the second connection member 232 may be disposed in the first region and the second region, respectively, so that the first connection member 231 and the second connection member 232 are in plug-in electrical connection to different side edges of the first circuit board 21, so as to realize the electrical connection between the first circuit board 21 and the second circuit board 22 and facilitate the wiring design of the first circuit board 21 and the second circuit board 22.

In an alternative embodiment, the first circuit board 21 is provided on top of the transformer 20. The first circuit board 21 and the second circuit board 22 can be electrically connected through a vertically arranged electrical connection member without affecting the connection of the transformer 20 to an external power source, and the structure is simple and easy to realize.

Figure 5:
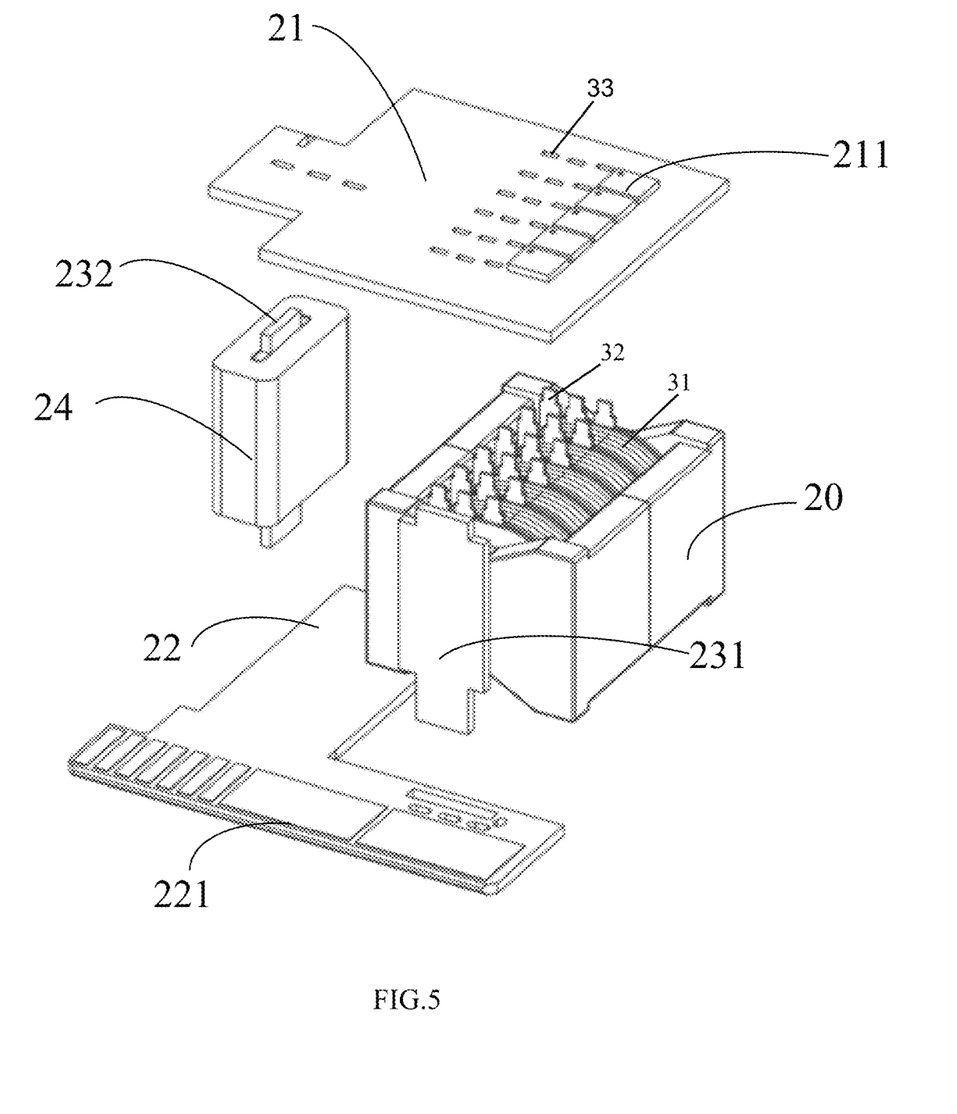
FIG. 5 shows an exploded view of a synchronous rectification assembly according to a specific embodiment of the present application including an inductor.

In an alternative embodiment, as shown in FIG. 5, the synchronous rectification assembly further comprises an inductor 24 disposed on the second connection member 232.

It can be understood that the first circuit board 21 is disposed on top of the transformer 20, the second circuit board 22 is disposed around the transformer 20, and the first circuit board 21 and the second circuit board 22 are electrically connected by a vertical electrical connection piece 23. In order to further simplify the structure of the rectification assembly and reduce the volume, the inductor 24 in the synchronous rectification assembly can be arranged on the electrical connection piece 23, so as to avoid the problem that providing the inductor 24 separately requires a large additional space.

In an alternative embodiment, the connection member is arranged vertically, the top of the connection member is in plug-in electrical connection to the first circuit board 21, and the bottom of the connection member is in plug-in electrical connection to the second circuit board 22. Similarly, the plug-in electrical connection is simple, has a compact structure and facilitates the miniaturization of the structure.

In an alternative embodiment, the first circuit board 21 is arranged parallel to the second circuit board 22. Of course, in other embodiments, the first circuit board 21 and the second circuit board 22 may adopt other positional relationships, which is not limited in this application.

Figure 6:
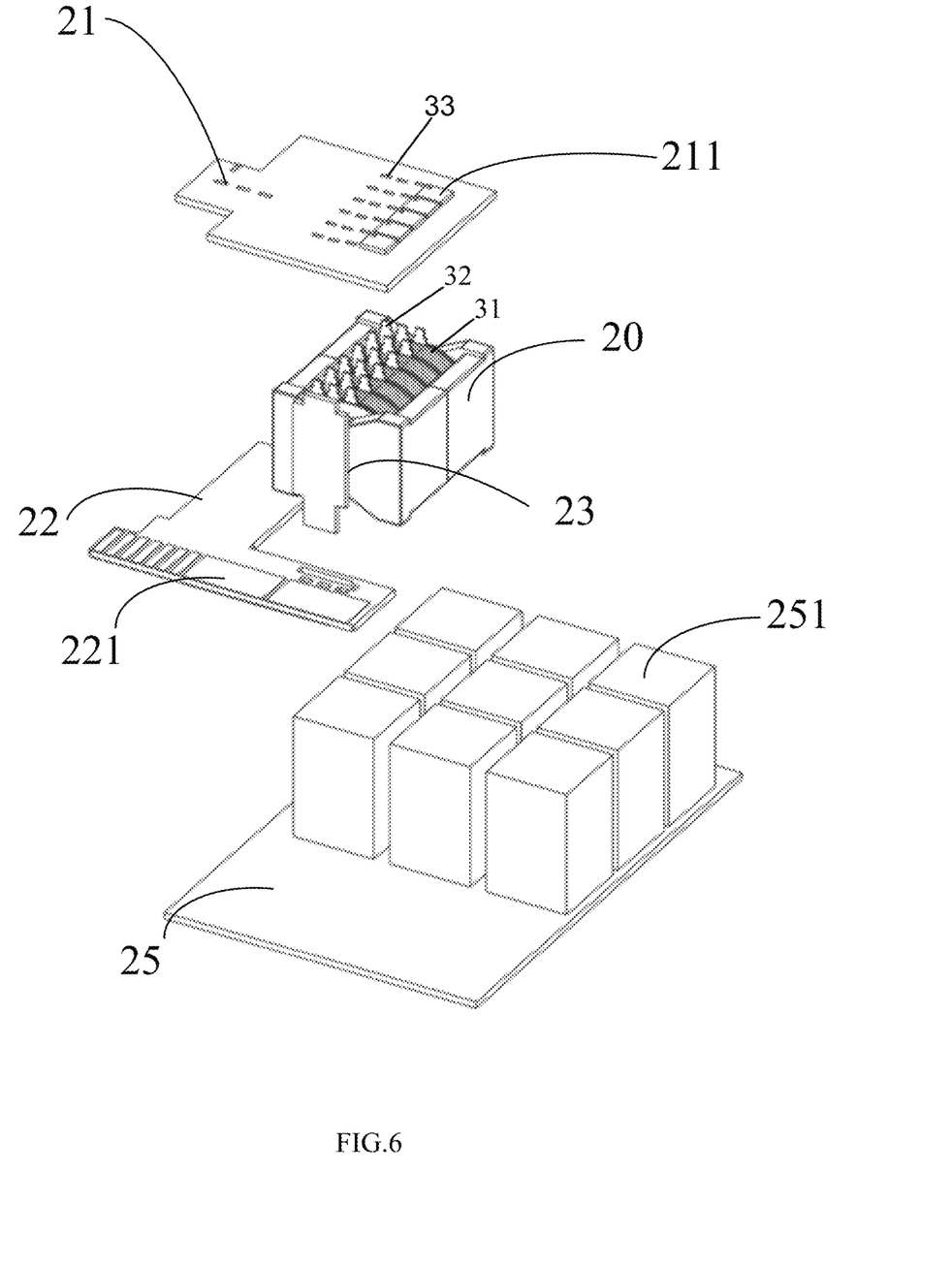
FIG. 6 shows an exploded view of a synchronous rectification assembly according to a specific embodiment of the present application including a power supply main board.

In an alternative embodiment, as shown in FIG. 6, the synchronous rectification assembly further comprises a power supply main board 25. The power supply main board 25 is arranged below the second circuit board 22.

It can be understood that since the conductive contact 221 needs to be in contact and electrical connection to the server, it needs to have a certain height. Therefore, the power supply main board 25 may be arranged in the space below the second circuit board 22. In this alternative embodiment, the transformer 20 is higher in height than the power supply main board 25, and the first circuit board 21 is disposed above the transformer 20, the electronic element 251 on the power supply main board 25 does not obstruct the heat dissipation airflow of the transformer 20, and the heat dissipation effect of the transformer 20 is improved.

In an alternative embodiment, when the power supply main board 25 is included in the synchronous rectification assembly, at least two of the power supply main board 25, the second circuit board 22 and the first circuit board 21 may be arranged in parallel. Of course, in other embodiments, the power supply main board 25, the second circuit board 22 and the first circuit board 21 may adopt other positional relationships, which is not limited in this application.

In conclusion, in the synchronous rectification assembly provided in the embodiment of the present application, the output signal outputted by the transformer is transmitted to the conductive contact 221 in a shorter transmission path, which shortens the transmission path of the output signal with large current and effectively reduces the energy loss of the output signal. In addition, the synchronous rectification assembly has compact structure, small size and simple design. Furthermore, the transformer 20 in the synchronous rectification assembly is not provided on the power supply main board 25, and the electronic element 251 on the power supply main board 25 does not affect the heat dissipation of the transformer 20, so that the heat dissipation effect of the transformer 20 can be improved, and the safety problem caused by the excessive temperature can be prevented.

Based on the same principle, this embodiment further discloses a manufacturing method of a synchronous rectification assembly. The method comprising:

S100: electrically connecting a transformer 20 to a first circuit board 21; and S200: electrically connecting an electrical connection piece 23 to the first circuit board 21 and a second circuit board 22 respectively, such that the first circuit board 21 performs synchronous rectification on an output signal of the transformer 20 and then transmits the output signal to a conductive contact 221 of the second circuit board 22 through the electrical connection piece 23, wherein the second circuit board 22 is provided with a conductive contact 221 for being electrically connected to an external apparatus.

Since the method solves the problem in accordance with the principle similar to the synchronous rectification assembly described above, the implementation of the method may be found by referring to the implementation of the synchronous rectification assembly, and is not repeated herein.

Based on the same principle, this embodiment further discloses a power supply. The power supply includes a synchronous rectification assembly as described in this embodiment.

Since the power supply solves the problem in accordance with the principle similar to the synchronous rectification assembly described above, the implementation of the power supply may be found by referring to the implementation of the synchronous rectification assembly, and is not repeated herein.

The various embodiments in the specification are described in a progressive manner, and the same or similar parts between the various embodiments may be referred to each other, and each embodiment focuses on the differences from the other embodiments. In particular, the system embodiment is simply described since it is substantially similar to the method embodiment, and please refer to the description of the method embodiment for the relevant content.

The teachings of all patents, published applications and references cited herein are incorporated by reference in their entirety.

The above descriptions are only embodiments of the present application and are not intended to limit the application. Various changes and modifications can be made to the present application by those skilled in the art. Any modifications, equivalents, improvements, etc. made within the spirit and scope of the present application are intended to be included within the scope of the claims of the present application.

What is claimed is:

1. A synchronous rectification assembly, characterized in comprising a first circuit board, a transformer, an electrical connection piece and a second circuit board;
    wherein the transformer is electrically connected to the first circuit board, and the second circuit board is provided with a conductive contact for being electrically connected to an external apparatus, and the electrical connection piece is electrically connected to the first circuit board and the second circuit board respectively;
    the first circuit board is configured to perform synchronous rectification on the output signal of the transformer and then transmit the output signal to the conductive contact of the second circuit board through the electrical connection piece.

2. The synchronous rectification assembly according to claim 1, characterized in that, the transformer comprises a primary side assembly and a secondary side assembly, the secondary side assembly includes a plurality of secondary side windings, and the plurality of secondary side windings are electrically connected to the first circuit board.

3. The synchronous rectification assembly according to claim 2, characterized in that, each of the secondary side assemblies comprises a pin, and a metal hole corresponding to each of the pins is formed on the first circuit board;
    the pins are in plug-in electrical connection to the corresponding metal holes on the first circuit board.

4. The synchronous rectification assembly according to claim 2, characterized in that, the primary side winding and the secondary side winding are in plural, and the primary side winding and the secondary side winding are arranged alternately.

5. The synchronous rectification assembly according to claim 1, characterized in that, the connection member includes a first connection member and a second connection member, and the conductive contact includes a positive power transmission contact and a negative power transmission contact;
    the first connection member is electrically connected to the negative power transmission contact through wiring on the second circuit board;
    the second connection member is electrically connected to the positive power transmission contact through wiring on the second circuit board.

6. The synchronous rectification assembly according to claim 5, characterized in further comprising an inductor;

the inductor is provided on the second connection member.

7. The synchronous rectification assembly according to claim 5, characterized in that, the second circuit board includes a first region and a second region surrounding the outside of the transformer and being perpendicular to each other;
the conductive contact and the first connection member are disposed in the first region, and the second connection member is disposed in the second region.

8. The synchronous rectification assembly according to claim 1, characterized in that, the first circuit board is provided on top of the transformer.

9. The synchronous rectification assembly according to claim 1, characterized in that, the connection member is arranged vertically, the top of the connection member is in plug-in electrical connection to the first circuit board, and the bottom of the connection member is in plug-in electrical connection to the second circuit board.

10. The synchronous rectification assembly according to claim 1, characterized in that, the first circuit board is arranged parallel to the second circuit board.

11. The synchronous rectification assembly according to claim 1, characterized in further comprising a power supply main board;
the power supply main board is arranged below the second circuit board.

12. The synchronous rectification assembly according to claim 11, characterized in that, at least two of the power supply main board, the second circuit board and the first circuit board are arranged in parallel.

13. A power supply, characterized in comprising a synchronous rectification assembly according to claim 1.

14. A manufacturing method of a synchronous rectification assembly, characterized in comprising the following steps of:
electrically connecting a transformer to a first circuit board;
electrically connecting an electrical connection piece to the first circuit board and a second circuit board respectively, such that the first circuit board performs synchronous rectification on an output signal of the transformer and then transmits the output signal to a conductive contact of the second circuit board through the electrical connection piece, wherein the second circuit board is provided with a conductive contact for being electrically connected to an external apparatus.

* * * * *